United States Patent
Herbsommer et al.

(10) Patent No.: US 8,455,361 B2
(45) Date of Patent: Jun. 4, 2013

(54) ELECTROLESS PLATING OF POROUS AND NON-POROUS NICKEL LAYERS, AND GOLD LAYER IN SEMICONDUCTOR DEVICE

(75) Inventors: Juan Alejandro Herbsommer, Schnecksville, PA (US); Osvaldo Lopez, Annandale, NJ (US)

(73) Assignee: Texas Instruments Incorporated, Dallas, TX (US)

(*) Notice: Subject to any disclaimer, the term of this patent is extended or adjusted under 35 U.S.C. 154(b) by 72 days.

(21) Appl. No.: 12/943,341

(22) Filed: Nov. 10, 2010

(65) Prior Publication Data

US 2011/0163454 A1    Jul. 7, 2011

Related U.S. Application Data

(60) Provisional application No. 61/293,107, filed on Jan. 7, 2010.

(51) Int. Cl.
*H01L 21/44* (2006.01)

(52) U.S. Cl.
USPC ............ 438/678; 438/652; 438/614; 438/612

(58) Field of Classification Search
USPC .......................................... 438/678; 439/678
See application file for complete search history.

(56) References Cited

U.S. PATENT DOCUMENTS

| | | | |
|---|---|---|---|
| 6,686,660 B2 * | 2/2004 | Nemoto | 257/737 |
| 2003/0129310 A1 | 7/2003 | Sinha | |
| 2005/0245076 A1 | 11/2005 | Bojkov et al. | |

FOREIGN PATENT DOCUMENTS

| | | |
|---|---|---|
| EP | 1737036 A2 | 12/2006 |
| KR | 1020030095688 A | 12/2003 |

* cited by examiner

*Primary Examiner* — Marcos D Pizarro Crespo
*Assistant Examiner* — Cesar Lopez
(74) *Attorney, Agent, or Firm* — Steven A. Shaw; W. James Brady; Frederick J. Telecky, Jr.

(57) ABSTRACT

A method for maintaining non-porous nickel layer at a nickel/passivation interface of a semiconductor device in a nickel/gold electroless plating process. The method can include sequentially electroless plating of each of the nickel layer and gold layer on the device layer to pre-determined thicknesses to prevent corrosion of the nickel layer from reaching the device layer during the electroless gold plating process.

4 Claims, 3 Drawing Sheets

ELECTROLESS PLATING OF POROUS AND NON-POROUS NICKEL LAYERS, AND GOLD LAYER IN SEMICONDUCTOR DEVICE

RELATED APPLICATIONS

This application claims priority from U.S. Provisional Patent Application Ser. No. 61/293,107, filed Jan. 7, 2010, which is hereby incorporated by reference in its entirety.

DESCRIPTION

1. Field

Embodiments of this invention relate generally to semiconductor fabrication and more particularly, to a structure for maintaining mechanical integrity of layer interfaces and junctions at completion of an electroless plating process.

2. Background

Electroless plating is a method for plating a nickel (Ni) layer and a gold (Au) layer over metal pads (e.g. aluminum pads) of a semiconductor chip. Electroless plating is advantageous over electrolytic plating because the equipment for electroless plating is less expensive and the method consumes less nickel and gold material.

When Ni/Au electroless plating is used in plating semiconductor devices, it has been found by the inventor that the Ni reacts with the Au and creates regions of "corrosion" at critical interfaces and junctures of the device layers. This corrosion affects a bond between the Ni and underlying passivation (PO) layer in particular. Corrosion can be in the form of a very porous Ni layer along the Ni/PO interface, voids, and regions where the Ni layer is very rich in Au. Because of the corrosion, moisture and ionic contaminants can migrate toward the active area of the IC, and cause device failure.

Accordingly, a need exists to maintain the integrity of the nickel layer at device layer interfaces and junctions, even upon completion of an electroless plating process. As further explained in the exemplary embodiments herein, the integrity can be maintained by preserving a layer of non-porous nickel at the Ni/PO interface.

BRIEF SUMMARY

These and other problems are generally solved or circumvented, and technical advantages are generally achieved, by preferred exemplary embodiments herein which disclose methods for maintaining a mechanical bond between layer interfaces and junctions of a semiconductor device upon completion of an electroless plating process.

Exemplary embodiments can include determining a thickness of a gold layer, then determining a thickness of nickel needed to have a non-porous layer of nickel remaining at the Ni/PO interface and Ni/PO/Al junction upon completion of the gold plating process.

A further exemplary embodiment can include an underlying metal pad, a non-porous nickel layer at the junction of the Ni/PO/Al, a porous nickel layer over the non-porous nickel layer, a gold layer over the porous nickel, and a gold rich nickel region between the gold layer and the porous nickel region.

Additional embodiments of the disclosure will be set forth in part in the description which follows, and in part will be obvious from the description, or may be learned by practice of the present disclosure. The embodiments of the disclosure will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

In the following description, reference is made to the accompanying drawings that form a part thereof, and in which is shown by way of illustration specific exemplary embodiments which may be practiced. Wherever possible, the same reference numbers will be used throughout the drawings to refer to the same or like parts. These embodiments are described in sufficient detail to enable those skilled in the art to practice the embodiments and it is to be understood that other embodiments may be utilized and that changes may be made without departing from the scope of the invention. The following description is, therefore, merely exemplary.

As used herein, the term "ENIG" refers to electroless nickel immersion gold, and is a type of surface plating used for printed circuit boards. ENIG can include electroless nickel plating covered with a thin layer of immersion gold, which protects the nickel from oxidation.

According to embodiments, a mechanical integrity is maintained at the Ni/PO interface and the Ni/PO/Al junction with a layer of nonporous nickel, upon completion of the electroless plating process.

Figure 1:
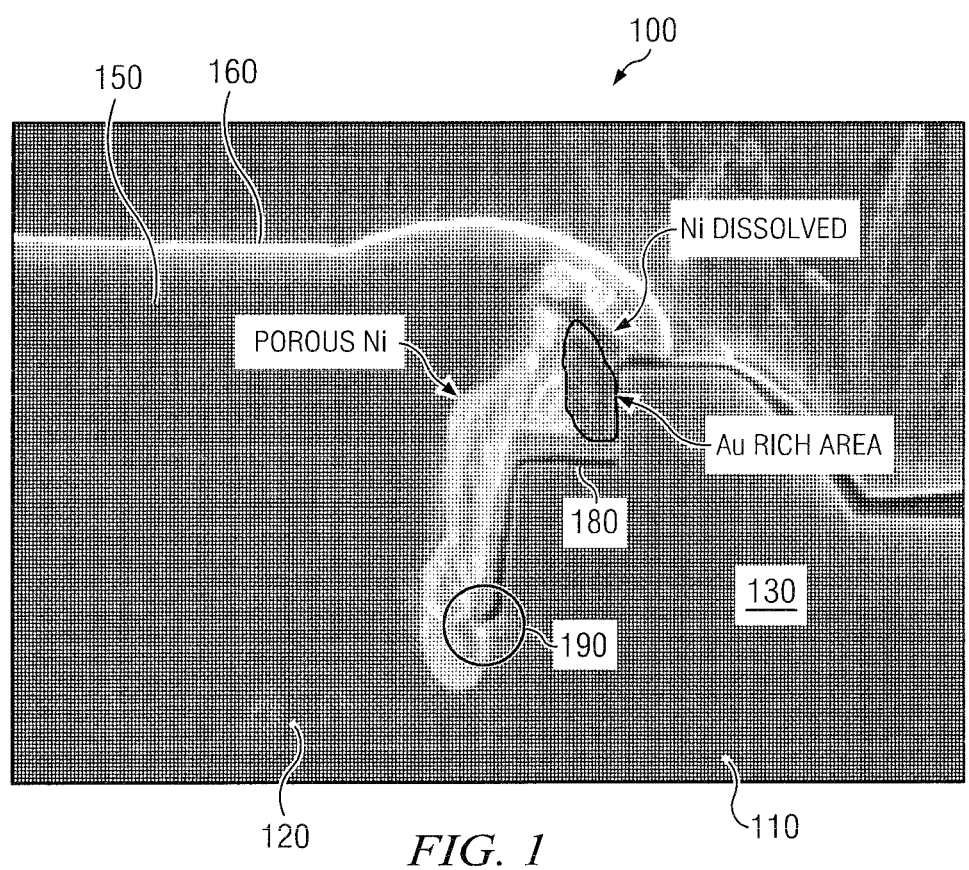
FIG. 1 is an SEM cross sectional image of ENIG layers near a nickel/passivation interface of a semiconductor device, according to an embodiment of the present disclosure.

SEM micrographs, as shown in FIG. 1 demonstrate the areas of corrosion in an exemplary semiconductor device 100. In FIG. 1, a portion of the semiconductor device 100 is depicted and includes certain layers pertinent to the exemplary embodiments herein. Specifically, the device 100 can include a substrate 110, a metal pad 120 on the substrate 110, a passivation layer 130 on the substrate 110 and metal pad 120, and a Ni/Au electroless plating layer 150/160. An interface 180 can be seen between the nickel layer 150 and passivation layer 130, and a junction 190 can be seen at a joint of the metal pad 120, nickel 150 and passivation layer 130.

The corrosion depicted in FIG. 1 can be caused by a galvanic attack of gold on the nickel layer during a typical electroless process. Three regions of corrosion can be observed in FIG. 1, including: 1) an area where the galvanic attack (e.g. a hyperactive electrochemical reaction between the gold and the nickel) produced a very porous nickel layer;

2) a region where the nickel was completely dissolved creating a void; and 3) a region where an EDX detected a nickel layer very rich in gold.

It is applicant's discovery that the bond between the nickel and the passivation layer 130 (passivating oxide (PO)) is mechanical and not chemical. This mechanical bond is weakened when nickel becomes porous, the porosity enabling gold atoms to diffuse into the nickel layer and replace nickel atoms by substitution during the gold plating reaction. The depletion of nickel near the gold layer causes nickel atoms to diffuse towards the gold layer and thus create voids in the underlying nickel layer 150. The voids allow foreign chemical agents such as moisture and ionic contaminants to penetrate, migrate through the openings, and reach an active area of the integrated circuit to damage the device, and ultimately cause device failure. In other words, if the integrity of the nickel layer at the Ni/PO interface or Ni/PO/Al junction is compromised, contaminant ions can reach the device to cause corrosion of the metal pad, and device leakages if the ions reach the active area of the device.

Figure 2:
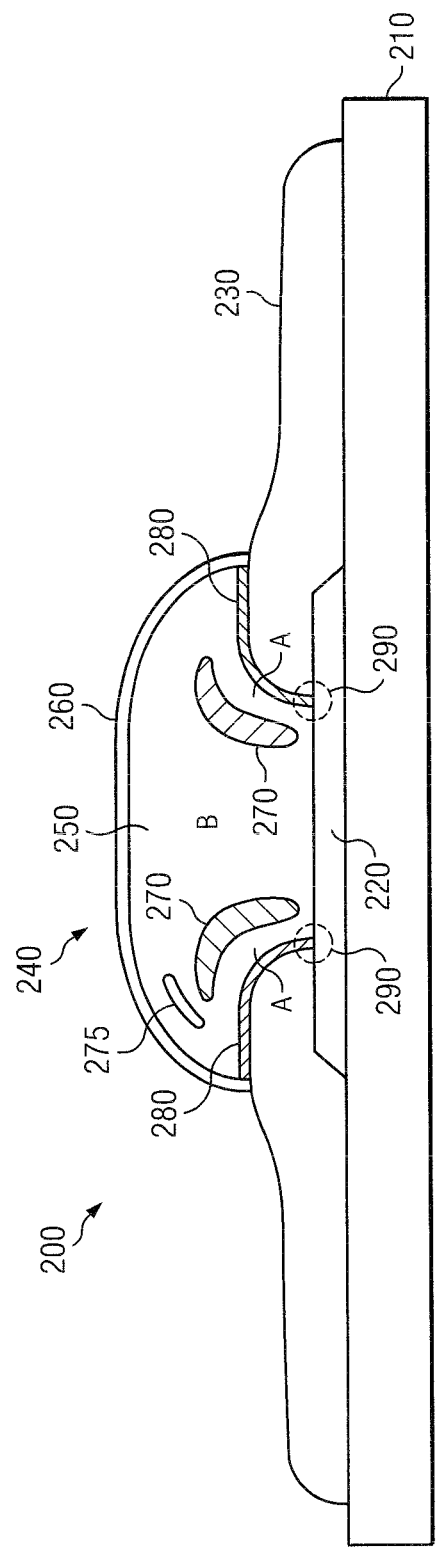
FIG. 2 is a cross sectional view of a semiconductor device according to an embodiment of the present disclosure.

FIG. 2 illustrates a semiconductor device 200, according to the present disclosure. It should be readily apparent to those skilled in the art that FIG. 2 is exemplary and that other components can be added or existing components can be removed or modified without departing from the scope of the exemplary embodiments.

The semiconductor device 200 can include a substrate 210, a metal contact pad 220 formed on the substrate 210, a passivation layer 230 formed over the substrate 210 and a portion of the metal contact pad 220, and an electroless plated layer of Ni 250 and Au 260 formed over the metal pad 220 and passivation layer 230. The electroless plated Ni layer 250 can include a first non-porous Ni layer 250A, a porous Ni layer 270, and a second non-porous Ni layer 250B. The porous Ni layer 270 is sandwiched between non-porous Ni layers 250A and 250B. The second non-porous nickel layer 250B includes that portion of an initial electroless nickel deposition not attacked by the gold layer 260 during electroless plating of the gold layer 260 in the ENIG process.

The substrate 210 can include a silicon substrate as known in the art. The metal contact pad 220 can include, for example copper (Cu) or aluminum (Al). For purposes of the following, and without intending it to be limiting, the metal contact pad 220 will be referred to as the Al pad. The passivation layer 230 can include a passivating oxide layer as known in the art.

As described, the electroplated Ni layer 250 of the Ni/Au electroless plating can include the first non-porous nickel layer 250A and porous nickel layer 270 over the first non-porous nickel layer 250A. The first non-porous nickel layer 250A can be at both a Ni/PO interface 280 and a Ni/PO/Al junction 290. The first and second non-porous Ni layers 250A and 250B remain upon completion of the electroless plating process because of a predetermined thickness of the electroless plated Ni layer 250 because of a predetermined thickness of the Au layer. The gold layer 260 is over the porous nickel layer 250, and an Au rich nickel region 275 can occur between the Au layer 260 and the porous nickel region 270 as a result of the electroless plating process, however, the first non-porous Ni layer 250A protects the passivation layer 230 from being directly affected by the Au rich nickel region 275. It will be appreciated that although the first and second non-porous nickel layers 250A, 250B and porous nickel layer 270 are referred to as "layers", it is intended that these layers can also be characterized as regions of the electroless nickel 250 because plating and the interaction of the gold layer with the nickel does not necessarily result in a uniformity that will result in layers per se.

As depicted in FIG. 2, the electroless nickel layer 250 can be of a thickness to maintain a mechanical integrity of the device 200 at the Ni/PO interface 280 and the Ni/PO/Al junction 290. As also depicted in FIG. 2, the electroless nickel layer 250 can be of a thickness sufficient to achieve a predetermined thickness of the Au layer 260 without a thickness of the porous Ni layer 270 reaching the passivation layer 230, the metal pad 220, or an active surface of the semiconductor device 200.

Figure 3A:
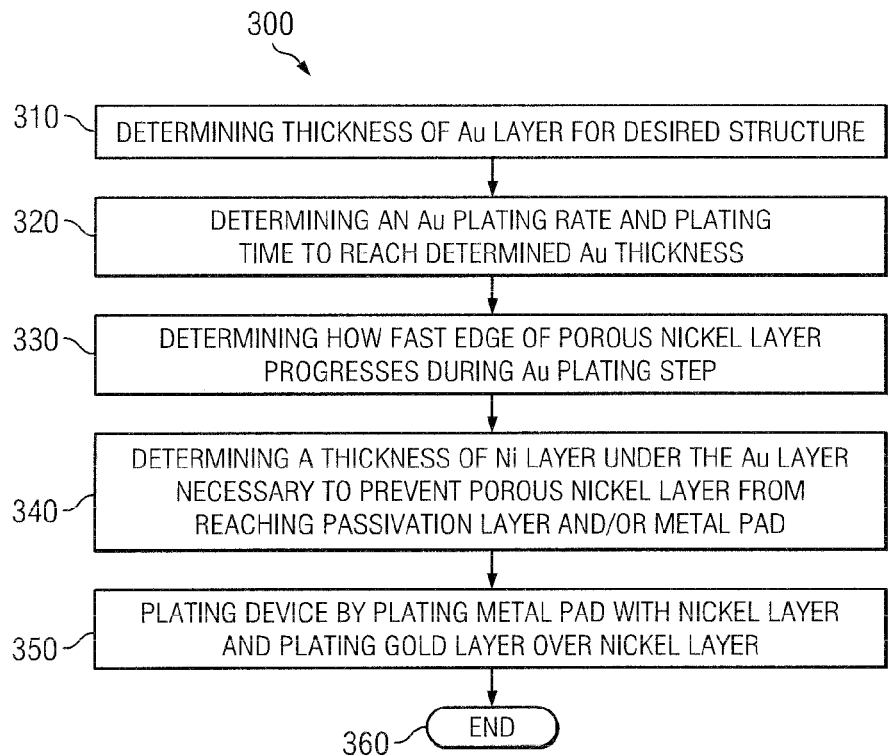
FIGS. 3A and 3B illustrate a method of forming a semiconductor device, according to an embodiment of the present disclosure.

FIG. 3A illustrates a flow diagram 300 of one embodiment of a process for making semiconductor devices according to the present disclosure. It should be readily apparent to those of ordinary skill in the art that the flow diagram 300 depicted in FIG. 3 represents a generalized schematic illustration and that other steps can be added or existing steps can be removed or modified.

As shown in block 310 of FIG. 3A, the process begins by determining how thick the Au layer will be for a resulting structure (e.g. for wire-bonding and soldering). As shown in block 320, the process includes then determining an Au plating rate and plating time to reach the determined Au thickness. As shown in block 330, the process includes then determining how fast a front edge of the porous nickel layer progresses during the Au plating step. As shown in block 340, the process continues by determining a thickness of Ni layer under the Au layer necessary to keep the porous (portion, i.e. spongy Ni layer) nickel layer from reaching the passivation layer and/or metal pad. Following the determination, and at block 350, a semiconductor chip can be processed by plating a metal pad with a nickel layer and plating a gold layer over the nickel layer. The process can conclude at block 360.

In the method, the non-porous nickel layer forms a mechanical bond with the passivation layer. The method maintains a layer of non-porous nickel at an interface of the non-porous nickel layer/passivation layer, and at a junction of the non-porous nickel layer, passivation layer, and metal contact pad. The metal contact pad can be configured of aluminum (Al). Further, the electroless plating process can be an electroless nickel immersion gold (ENIG) process.

Figure 3B:
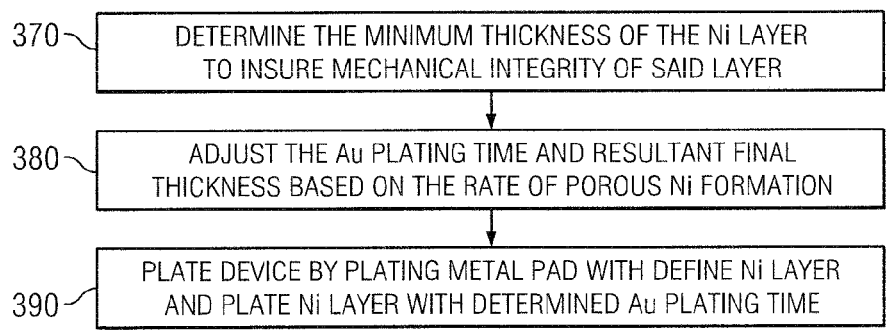

An alternative flow is illustrated in FIG. 3B at blocks 370, 380 and 390, whereby the Ni layer thickness is held to a fixed value and the Au thickness or plating time is optimized such that the porous Ni edge being formed remains at a reasonable distance from the metal pad/PO interface.

Advantages of the exemplary electroless plating process and resulting structure can include a cost advantage and simplicity over electrolytic plating. Another advantage is reliability at the structure in which the porous nickel region touches the metal (e.g. Al, Cu) pad. The exemplary embodiments are such that the resulting semiconductor devices are more robust in the presence of humidity and ionic contamination because the mechanical integrity at the interface between the passivation layer and the electroless Ni/Au prevents the humidity and the ions from reaching the active area of the devices.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

While the invention has been described with reference to the exemplary embodiments thereof, those skilled in the art will be able to make various modifications to the described embodiments without departing from the true spirit and scope. The terms and descriptions used herein are set forth by way of illustration and are not meant as limitations. In particular, although the method has been described by examples, the steps of the method may be performed in a different order than illustrated or simultaneously. Furthermore, to the extent that the terms "including", "includes", "having", "has", "with", or variants thereof are used in either the detailed description and the claims, such terms are intended to be inclusive in a manner similar to the term "comprising". As used herein, the term "one or more of" with respect to a listing of items such as, for example, A and B, means A alone, B alone, or A and B.

Other embodiments of the present disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a semiconductor device, comprising:
    forming a metal contact pad over a substrate;
    forming a passivation layer over the substrate and over a portion of the metal contact pad;
    electroless depositing a nickel layer over the metal contact pad and the passivation layer, wherein the nickel layer comprises a non-porous nickel layer and a porous nickel layer, the non-porous nickel layer forming a mechanical bond with the passivation layer creating a nickel/passivation interface of the semiconductor device;
    electroless depositing a gold layer over the nickel layers maintaining the non-porous nickel layer at a nickel/passivation interface of the semiconductor device, said maintaining comprising:
        determining a thickness of the gold layer;
        determining an electroless plating rate and a plating time of the gold layer to reach the determined thickness;
        determining a thickness of the nickel layer under the gold layer to maintain the non-porous nickel layer at the nickel/passivation interface and prevent the porous nickel layer from reaching the passivation layer at a termination of an electroless gold plating process; and
        following the determinations, sequentially electroless plating of each of the non-porous nickel layer and the gold layer on the device layer to the determined thicknesses.

2. The method of claim 1, wherein the deposited nickel and deposited gold further comprise a gold-rich nickel region between a gold region and a porous nickel region.

3. The method of claim 2, wherein the metal contact pad comprises an aluminum contact pad.

4. The method of claim 3, wherein the electroless plating process is an electroless nickel immersion gold plating process.

* * * * *